United States Patent [19]

Matsumoto et al.

[11] Patent Number: 5,377,406
[45] Date of Patent: Jan. 3, 1995

[54] PROCESS FOR PRODUCING A PRINTED CIRCUIT BOARD

[75] Inventors: Masuo Matsumoto; Naohiro Yoshida; Masaru Kojima, all of Saitama, Japan

[73] Assignee: CMK Corporation, Japan

[21] Appl. No.: 158,300

[22] Filed: Nov. 29, 1993

[30] Foreign Application Priority Data

Nov. 27, 1992 [JP] Japan .................. 4-341476

[51] Int. Cl.6 .................................. H05K 3/02
[52] U.S. Cl. ........................ 29/846; 156/659.1; 156/902; 427/96
[58] Field of Search ............... 156/659.1, 902; 428/901; 427/97, 96

[56] References Cited

U.S. PATENT DOCUMENTS

| | | | |
|---|---|---|---|
| 4,049,481 | 9/1977 | Morisaki | 428/901 X |
| 4,512,829 | 4/1985 | Ohta et al. | 156/659.1 |
| 4,756,795 | 7/1988 | Bakos et al. | 156/902 X |
| 4,804,615 | 2/1989 | Larson et al. | 156/659.1 X |
| 4,925,522 | 5/1990 | Avellino et al. | 156/902 X |
| 5,200,026 | 4/1993 | Okabe | 156/659.1 X |

Primary Examiner—Carl J. Arbes
Attorney, Agent, or Firm—Larson and Taylor

[57] ABSTRACT

A process for producing a printed circuit board is disclosed, in which use is made of a copper-clad laminate comprising a substrate and, superimposed thereon, a copper foil having its entire surface covered with a solder foil. A solder foil 4 is applied to cover the entire surface of a copper foil 2 superimposed on a substrate 1 (the copper foil 2 and the substrate 1 forming a copper-clad laminate 3). An etching resist is applied to the surface of the solder foil 4, and the solder foil 4 and the copper foil 2 are simultaneously etched to form a conductor circuit pattern 8. Thereafter, the etching resist is stripped off, and unneeded portions of the solder foil 4 are removed on the conductor circuit pattern 8 to thereby produce a printed circuit board. The above process of the invention facilitates soldering operation for the printed circuit board and reduces the production cost thereof.

17 Claims, 1 Drawing Sheet

PROCESS FOR PRODUCING A PRINTED CIRCUIT BOARD

BACKGROUND OF THE INVENTION

1. Field of The Invention

The present invention relates to a process for producing a printed circuit board.

2. Discussion of Related Art

For producing the conventional printed circuit board by etching the copper foil of a copper-clad laminate to form a desired printed circuit, the subtractive process is known, in which an etching resist is applied to only such portions of the copper foil of the copper-clad laminate as required to form a conductor pattern by printing or photography, followed by removal of the other portions of the copper foil by etching to thereby form the circuit of the conductor on the insulating substrate.

In the above conventional subtractive process, the etching resist covering the thus formed circuit pattern of the conductor is stripped off to expose the copper foil so that the circuit is completed. Thereafter, it is preferred that a solder layer having a thickness of 1 to 2 $\mu$m be disposed at land areas of the conductor circuit in order to ensure soldering of electronic components thereupon while preventing oxidation of the copper foil. Thus, generally, the soldering of electronic components requires additional steps comprising applying a solder resist to the conductor circuit after the formation thereof on the insulating substrate and disposing a solder layer on the land areas of the conductor circuit.

SUMMARY OF THE INVENTION

With a view toward improving the process for producing a printed circuit board, the inventors have made extensive and intensive studies. As a result, it has unexpectedly been found that the above-mentioned additional steps of the prior art can be obviated by simultaneous etching of solder and copper layers on a copper-clad laminate comprising a copper layer having its entire surface covered with a solder layer. Based on this unexpected finding, the present invention has been completed.

It is, therefore, an object of the present invention to provide a process for producing a printed circuit board with reduced cost by producing a conductor circuit pattern having a solder layer formed on land areas thereof through a simplified process.

The foregoing and other objects, features and advantages of the present invention will become apparent from the following detailed description and appended claim taken in connection with the accompanying drawings.

BRIEF DESCRIPTION OF THE DRAWINGS

In the drawings:

In FIGS. 1 through 7, like parts or portions are designated by like numerals.

DETAILED DESCRIPTION OF THE INVENTION

In order to attain the above objects, according to the present invention, there is provided a process for producing a printed circuit board, comprising the steps of:

providing a copper-clad laminate comprising a substrate and, superimposed thereon, a copper foil having its entire surface covered with a solder foil, applying an etching resist to the surface of the solder foil at areas corresponding to a predetermined conductor circuit pattern, simultaneously etching the solder and copper foils to remove the same at the areas other than those defined above, thereby forming a printed circuit, stripping off the etching resist on the printed circuit, and removing unneeded portions of the solder foil on the printed circuit.

An etching resist is applied to the surface of the solder foil of the copper-clad laminate only at such areas as required to form a conductor circuit pattern, followed by simultaneous removal of the solder foil and the copper foil at the other areas by etching to thereby produce a printed circuit board.

In the present invention, a solder foil can easily be applied to the entire surface of a copper-clad laminate, and a printed circuit having land areas thereof provided with a solder foil can easily be produced by virtue of the simultaneous etching of the solder and copper foils.

PREFERRED EMBODIMENT OF THE INVENTION

The present invention will now be described in greater detail with reference to the following preferred embodiment of the invention, which should not be construed as limiting the scope of the present invention.

FIGS. 1 to 7 are diagrammatic views for illustrating the process of the present invention for producing a printed circuit board from a copper-clad laminate.

Figure 1:
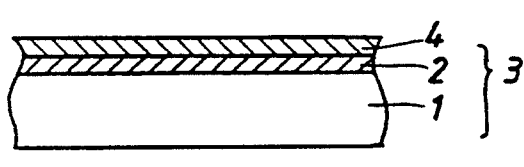
FIG. 1 is a partial cross-sectional view of a copper-clad laminate for use in the process of the present invention.

Referring specifically to FIG. 1, the copper-clad laminate for use in the process of the present invention comprises a copper-clad laminate 3 composed of a substrate 1 and, superimposed thereon, a copper foil 2 having a thickness of about 25 $\mu$m, the entire surface of the copper foil 2 being covered with a solder foil 4 having a thickness of 1 to 2 $\mu$m.

Figure 2:
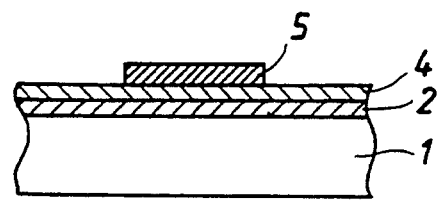
FIG. 2 is an explanatory view for illustrating an etching operation on a copper-clad laminate having a solder foil provided thereon.

Now, referring to FIG. 2, a positive circuit pattern of an etching resist 5 is formed on the surface of the solder foil 4 by printing or photography.

Figure 3:
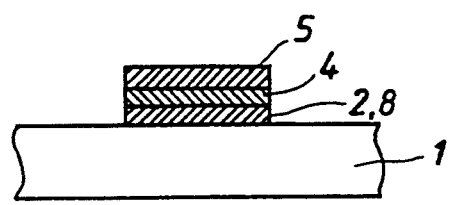
FIG. 3 is an explanatory view for illustrating a further etching operation on the copper-clad laminate.

Then, as shown in FIG. 3, etching with an etchant as described later is performed to simultaneously remove the solder foil 4 and the copper foil 2 at other areas than those covered with the etching resist 5, so that a desired conductor circuit pattern 8 covered with the solder foil 4 and then with the etching resist 5 is formed on the substrate 1.

Figure 4:
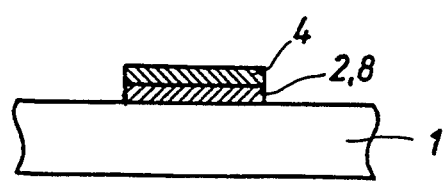
FIG. 4 is an explanatory view for illustrating a still further etching operation on the copper-clad laminate.

Subsequently, the etching resist 5 forming the uppermost layer of conductor circuit pattern 8 is stripped off to expose the solder foil 4 as shown in FIG. 4.

Figure 5:
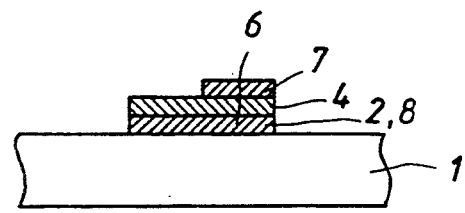
FIG. 5 is an explanatory view for illustrating a still further etching operation on the copper-clad laminate.

On the surface of the thus exposed solder foil 4, as shown in FIG. 5, an acid-resistant ink is provided to form a mask 7 (for example, the mask 7 is formed by printing the acid-resistant ink) at only land areas 6 where an electronic component is soldered.

Figure 6:
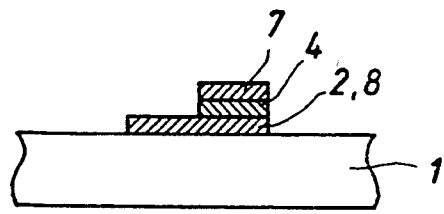
FIG. 6 is an explanatory view for illustrating a still further etching operation on the copper-clad laminate.

The solder foil 4 at other areas than those covered with the mask 7 is dissolved away with the conventional fluid for dissolution of solder, thereby causing the conductor circuit pattern 8 on the substrate 1 to have the solder foil 4 disposed at only the land areas 6 as shown in FIG. 6.

Figure 7:
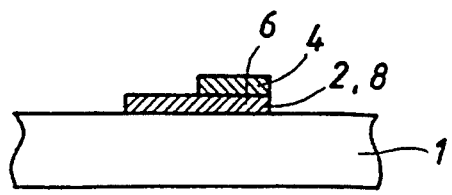
FIG. 7 is an explanatory view for illustrating a still further etching operation on the copper-clad laminate.

The mask 7 is, thereafter, stripped off to obtain a printed circuit board as shown in FIG. 7.

By virtue of the above described simultaneous etching of the solder foil 4 and the copper foil 2, a conductor circuit pattern having the solder foil 4 formed at land areas thereof can be produced by a simplified process, so that production cost can be reduced. Moreover, since the solder foil 4 is provided at a uniform thickness prior to the etching, the thickness of the solder foil covering the land areas 6 after the etching can be uniform.

With respect to various etchants for use in the above-mentioned simultaneous etching of the solder foil 4 and the copper foil 2, the etching performance has been evaluated. The method and results are described below.

First, the solubility of each of lead and tin in pure form in ferric chloride solution (40° Be) has been evaluated. As a result, it has been found that lead chloride is formed on the surface of a test piece of lead in the ferric chloride solution, so that dissolution does not reach an inner part of the test piece of lead. On the other hand, tin has been found to dissolve to the inner part of the test piece.

Then, the etching performance of ferric chloride solution (40° Be) capable of etching copper has been evaluated with respect to solders corresponding to solders H15A and H63A as defined in Japanese Industrial Standards, as follows.

In the evaluation test, use was made of a test piece having a size of 3 mm×50 mm×100 mm.

In the case of the solder (hereinafter referred to as solder H15A) corresponding to the above solder H15A, the ferric chloride solution causes the test piece to have a thin layer of lead chloride formed on the surface thereof, so that dissolution does not reach a further inner part of the test piece. Since the solder H15A has a tin content as low as 15%, after dissolution of tin, peripherally formed lead in spongy form is converted to lead chloride, so that dissolution does not much proceed in the thickness direction of the test piece.

On the other hand, in the case of the solder (hereinafter referred to as solder H63A) corresponding to the above solder H63A, the tin content is as high as 63% as compared with that of solder H15A, so that dissolution proceeds deep in the thickness direction of the test piece to thereby attain deeper penetration of the ferric chloride solution, resulting in deposition of a thick layer of lead chloride.

In the above test, the test pieces had white particulate precipitate on the surface thereof. It was confirmed by X-ray diffractometry that the white particulate precipitate was lead chloride. Further, it was found that transparent crystals of lead chloride precipitated by gradual cooling of the ferric chloride solution used in the etching.

In addition, an etching test was conducted using a solder foil having a thickness of 10 μm. As a result, lead chloride was separated in an amount corresponding to that contained in the solder foil to float on and precipitate in the etchant. Lead chloride is nearly insoluble in the ferric chloride solution while it is sparingly soluble when the solution is heated to e.g., about 50° C. or higher, so that, in practical etching, the lead chloride would have to be filtered off.

Moreover, the etching performance of each of various etchants capable of dissolving copper, including the ferric chloride solution, with respect to solders was evaluated in the following manner. Both solder stripping agent 684X-A and tin stripping agent 684S-A used as etchants are products of Nippon Mining Co., Ltd., Japan.

As in the above tests, solders H15A and H63A were used. However, each test piece had a size of 3 mm×50 mm×60 mm, and was lightly polished with Scotch Bright as a pretreatment for etching to thereby remove any oxide matter on the surface thereof, followed by washing with water and drying.

In the etching, each test piece was immersed in 500 ml of an etchant heated to 50° C. while stirring for 10 min. Results are shown in the following Table. From the test results, it is apparent that the etching performance of each etchant depends on the composition of the solder as the test piece but there are etchants capable of effectively dissolving the solder, i.e., capable of dissolving both the solder and copper. That is, there are etchants suitable for use in simultaneous etching of the solder and copper foils in accordance with the present invention.

As described above, in the process of the present invention, use is made of a copper-clad laminate having its entire surface covered with a solder foil and simultaneous etching of the solder and copper foils is conducted on this copper-clad laminate, whereby the process for producing a conductor circuit pattern is simplified to thereby effect cost reduction in the production of a printed circuit board.

TABLE

Evaluation of Dissolving Power of Various Etchants

| Etchant | Solder H15A weight decrease (g) | Solder H15A evaluation | Solder H63A weight decrease (g) | Solder H63A evaluation |
| --- | --- | --- | --- | --- |
| Solder stripping agent 684X-A | 6.91 | ○ | 4.75 | ○ |
| Tin stripping agent 684S-A | 0.04 | X | 1.99 | ○ |
| 15% aq. hydrochloric acid | 0.03 | X | 0.01 | X |
| 48% aq. sulfuric acid | 0.04 | X | 0.02 | X |
| Ferric chloride solution 40° Be | 0.15 | △ | 2.57 | ○ |
| Cupric chloride solution | 1.12 | ○ | 5.58 | ○ |
| 1:1 (v/v) aq. phosphoric acid | 0.01 | X | 0.03 | X |
| 30% aq. acetic acid | 0.03 | X | 0.07 | X |
| 10% aq. sulfuric acid containing 3.5% (v/v) hydrogen peroxide | 0.19 | △ | 0.21 | △ |
| 30% aq. acetic acid containing 3.5% (v/v) hydrogen peroxide | 2.88 | ○ | 0.13 | △ |
| 30% aq. nitric | 1.99 | ○ | 21.55 | ◉ |

TABLE-continued

Evaluation of Dissolving Power of Various Etchants

| Etchant | Solder H15A | | Solder H63A | |
|---|---|---|---|---|
| | weight decrease (g) | evaluation | weight decrease (g) | evaluation |
| acid | | | | |

⊚: most suitable
○: suitable
△: less suitable
X: unsuitable

What is claimed is:

1. A process for producing a printed circuit board, comprising the steps of:
   providing a copper-clad laminate comprising a substrate and, superimposed thereon, a copper foil having its entire surface covered with a solder foil,
   applying an etching resist to the surface of the solder foil at areas corresponding to a predetermined conductor circuit pattern,
   simultaneously etching the solder and copper foils to remove the same at the areas other than those defined above, thereby forming a printed circuit,
   stripping off the etching resist on the printed circuit, and
   removing unneeded portions of the solder foil on the printed circuit.

2. The process for producing a printed circuit board as claimed in claim 1 wherein said copper-clad laminate consists of said substrate, said copper foil, and said solder foil covering the entire surface of and coextensive with said copper foil.

3. The process for producing a printed circuit board as claimed in claim 2 wherein said copper foil has a thickness of about 25 $\mu$m, and wherein said solder foil has a thickness of from 1 $\mu$m to and including 2 $\mu$m.

4. The process for producing a printed circuit board as claimed in claim 1 wherein said solder foil has a thickness of from 1 $\mu$m to and including 2 $\mu$m.

5. The process for producing a printed circuit board as claimed in claim 4 wherein said copper foil has a thickness of about 25 $\mu$m.

6. The process for producing a printed circuit board as claimed in claim 1 wherein said solder foil has a uniform thickness.

7. The process for producing a printed circuit board as claimed in claim I wherein said solder is comprised of a solder type H63A as defined in the Japanese Industrial Standards and wherein said etching step utilizes about a 30 percent aqueous nitric acid solution as the etchant to simultaneously etch said solder and copper foils.

8. The process for producing a printed circuit board as claimed in claim 1 and further including the step of applying an acid-resistant ink to form a mask corresponding to a predetermined pattern on said stripped printed circuit, and then removing only said solder foil at the areas other than those defined by said mask.

9. A subtractive process for producing a printed circuit board, comprising the steps of:
   providing a laminate comprised of a bottom substrate having an upper surface, a copper layer superimposed on at least a portion of said substrate top surface, said copper layer having an upper surface, and a solder layer superimposed on, coextensive with and covering the entire copper layer upper surface, said solder layer having an upper surface;
   simultaneously etching the solder and copper foils to remove in the same step predetermined portions of said copper foil and the solder foil covering said copper foil portions, thereby forming a printed circuit:
   stripping off the etching resist on the printed circuit; and
   removing unneeded portions of the solder foil on the printed circuit.

10. The subtractive process for producing a printed circuit board as claimed in claim 9 and further including the step of applying an etching resist to the surface of the solder foil at areas corresponding to a predetermined conductor circuit pattern before said etching step.

11. The process for producing a printed circuit board as claimed in claim 10 wherein said copper-clad laminate consists of said substrate, said copper layer, and said solder layer covering the entire surface of end coextensive with said copper layer.

12. The process for producing a printed circuit board as claimed in claim 11 wherein said copper layer has a thickness of about 25 $\mu$m, and wherein said solder layer has a thickness of from 1 $\mu$m to and including 2 $\mu$m.

13. The process for producing a printed circuit board as claimed in claim 10 wherein said solder layer has a thickness of from 1 $\mu$m to and including 2 $\mu$m.

14. The process for producing a printed circuit board as claimed in claim 13 wherein said copper layer has a thickness of about 25 $\mu$m.

15. The process for producing a printed circuit board as claimed in claim 10 wherein said solder layer has a uniform thickness.

16. The process for producing a printed circuit board as claimed in claim 10 wherein said solder is comprised of a solder H63A as defined in the Japanese Industrial Standards and wherein said etching step utilises about a 30 percent aqueous nitric acid solution as the etchant to simultaneously etch said solder and copper layers.

17. The process for producing a printed circuit board as claimed in claim 10 and further including the step of applying an acid-resistant ink to form am ask corresponding to a predetermined pattern on said stripped printed circuit, and then removing only said solder layer at the areas other than those defined by said mask.

* * * * *